(12) United States Patent
Tille et al.

(10) Patent No.: US 11,531,415 B2
(45) Date of Patent: Dec. 20, 2022

(54) MODULE FOR A DISPLAYING AND/OR OPERATING DEVICE, DISPLAYING AND/OR OPERATING DEVICE, METHOD FOR PRODUCING A MODULE AND MEANS OF TRANSPORTATION

(71) Applicant: Bayerische Motoren Werke Aktiengesellschaft, Munich (DE)

(72) Inventors: Thomas Tille, Munich (DE); Florian Miedl, Moosburg an der Isar (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/425,329

(22) PCT Filed: Jan. 17, 2020

(86) PCT No.: PCT/DE2020/100031
§ 371 (c)(1),
(2) Date: Jul. 23, 2021

(87) PCT Pub. No.: WO2020/151782
PCT Pub. Date: Jul. 30, 2020

(65) Prior Publication Data
US 2022/0100297 A1 Mar. 31, 2022

(30) Foreign Application Priority Data
Jan. 24, 2019 (DE) .......................... 102019101765.3

(51) Int. Cl.
*G06F 3/041* (2006.01)
*G06F 3/01* (2006.01)
*B60K 35/00* (2006.01)

(52) U.S. Cl.
CPC .............. *G06F 3/041* (2013.01); *B60K 35/00* (2013.01); *G06F 3/016* (2013.01); *B60K 2370/158* (2019.05); *G06F 2203/04103* (2013.01)

(58) Field of Classification Search
None
See application file for complete search history.

(56) References Cited

U.S. PATENT DOCUMENTS 9,442,613 B2 * 9/2016 Lee .................. G06F 3/0446
9,831,871 B2 11/2017 Lee et al.
(Continued)

FOREIGN PATENT DOCUMENTS

DE 102016007122 A1 12/2017
EP 2876468 A1 5/2015

OTHER PUBLICATIONS http://www.technisches-zeichnen.net/technisches-zeichnen/diverses/rauheitswerte.php.

*Primary Examiner* — Matthew Yeung
(74) *Attorney, Agent, or Firm* — 2SPL Patent Attorneys PartG mbB; Kieran O'Leary (57) ABSTRACT

A module (1) for a display and/or operating device (10), the module (1) comprising a first transparent electrode (3) having a first matrix of a plurality of electrode islands (3a, 3b, 3c); a transparent piezoelectric layer (2) having a first and a second area; a second transparent electrode (4); a transparent substrate (12); and a conductive path arrangement (25) having at least a first conductive path (24a) on the transparent piezoelectric layer (2), wherein the transparent substrate (12) is coated with the second transparent electrode (4) and the second transparent electrode (4) is disposed between the transparent substrate and the transparent piezoelectric layer (2), and the first area is coated with the first transparent electrode and the second area is coated with the (Continued)

3 second transparent electrode (4); and the electrode islands (3*a*, 3*b*, 3*c*) are arranged electrically insulated from one another on the first area of the transparent piezoelectric material (2), wherein the at least first conductive path (24*a*) of the conductive path arrangement (25) is electrically connected to at least one of the electrode islands (3*a*, 3*b*, 3*c*), and at least the first conductive path (24*a*) and/or at least one of the electrode islands (3*a*, 3*b*, 3*c*) has a rough surface structure with a maximum roughness depth of 4 µm.

11 Claims, 7 Drawing Sheets

(56) References Cited

U.S. PATENT DOCUMENTS

| | | | |
|---|---|---|---|
| 2008/0157235 A1* | 7/2008 | Rogers | H05K 1/0283 |
| | | | 257/415 |
| 2009/0167704 A1 | 7/2009 | Terlizzi et al. | |
| 2012/0313766 A1 | 12/2012 | Chappaz et al. | |
| 2012/0313874 A1 | 12/2012 | Chappaz et al. | |
| 2014/0240110 A1* | 8/2014 | Suzuki | G06F 3/0488 |
| | | | 340/407.1 |
| 2015/0185890 A1 | 7/2015 | Kaneko et al. | |
| 2015/0235728 A1 | 8/2015 | Poon | |
| 2015/0355771 A1 | 12/2015 | Watazu et al. | |
| 2016/0062505 A1 | 3/2016 | Hwang et al. | |
| 2017/0262099 A1* | 9/2017 | Nathan | G06F 3/0443 |
| 2020/0125815 A1* | 4/2020 | Lu | G06V 40/1306 |
| 2020/0401262 A1* | 12/2020 | Benaissa | G06F 3/043 |

\* cited by examiner

MODULE FOR A DISPLAYING AND/OR OPERATING DEVICE, DISPLAYING AND/OR OPERATING DEVICE, METHOD FOR PRODUCING A MODULE AND MEANS OF TRANSPORTATION

CROSS-REFERENCE TO RELATED APPLICATIONS

This application is a 35 U.S.C. § 371(c) national stage entry of PCT/DE2020/100031, filed on Jan. 17, 2020. That application claimed priority to German Application 10 2019 101 765.3 filed on Jan. 24, 2019. The contents of the earlier filed applications are incorporated by reference herein in their entirety.

FIELD

The invention relates to a module for a display and/or operating device, method of manufacturing a module, display device, and means of transport.

BACKGROUND

Currently, a haptic feedback of a display device to a user, in particular by a vibration when touched by the user, may be realized by means of piezo actuators or via the movement of the display and/or the surface by a magnet or an electric motor. However, the piezo actuators with mechanical coupling elements, which are usually not transparent, must be arranged in the peripheral area of the display, since the piezo actuators and the mechanical coupling elements otherwise restrict the view of the display.

US 2012/0313874 A1 and US 2012/0313766 A1 disclose piezo actuators attached to the edge of a display device. The piezo actuators are completely coated on two sides with continuous electrodes. If a touch of the display by an object, e.g. a finger, is detected, an electrical voltage is applied to the electrodes. This stimulates the piezo actuators to vibrate via the piezoelectric effect and the object touching the display device experiences haptic feedback and/or haptic response. However, the haptic feedback takes place simultaneously on the entire display. Thus, partial areas of the display cannot be individually stimulated for haptic feedback. Due to the arrangement of the piezo actuators in the edge area of the display, additional mechanical coupling elements are also required here.

Moreover, known touch surfaces, in particular touch displays, have anti-reflective surface coatings independent of the embodiment. However, touch sensor technology, haptic actuator technology, anti-shine, anti-fingerprint and anti-reflective coatings have to be implemented using different techniques. The simultaneous technical realization of a touch sensor technology, haptic actuator technology, anti-shine coating, anti-fingerprint coating and anti-reflective coating must be carried out via heterogeneous manufacturing steps and using different materials. As a result, the system properties of touch surfaces manufactured in this way are limited in terms of installation space and haptic effect. Furthermore, increased system and development costs as well as unfavourable quality characteristics arise.

Thus, it is an object of the present invention to provide position-selective haptic feedback on a display and/or operating device having good anti-reflective, anti-shine and anti-fingerprint properties with reduced manufacturing and material costs, and to alleviate the disadvantages of the aforementioned prior art.

SUMMARY

According to the invention, the task is solved by the independent claims.

According to a first aspect, the present invention relates to a module for a display and/or operating device (e.g. for a display device). In this context, a "module" is understood to be a component which may be arranged in particular on the area of a display and/or operating device which displays graphical display contents and/or enables direct interaction with the graphical display contents, for example a touch screen. Further, a "display device" may include a decorative surface. In particular, the module may be glued to such an area of the display and/or operating device. The module is transparent in this respect due to the features described below. In this context, "transparency" is understood to mean, in particular, a colourless transparency, such as that of a window glass. However, the concept of transparency used herein requires at least that the graphically represented contents of a display of a display and/or operating device must be recognizable and/or visible to an observer through the module.

The module comprises a transparent substrate coated with a second transparent electrode. The second transparent electrode material is in turn coated on its other side with a second area of a transparent piezoelectric material. Thus, the second electrode is "sandwiched" between the substrate and the transparent piezoelectric material. Further, a first surface of the transparent piezoelectric material is coated with a first transparent electrode. For example, the first and second areas of the transparent piezoelectric layer are parallel. In other words, the electrodes are arranged on opposite areas of the transparent piezoelectric layer. Here, the first transparent electrode comprises a first matrix of electrode islands. In other words, a transparent electrode layer comprising a two-dimensional pattern, that is, a first matrix of electrode islands, is present on the transparent piezoelectric material. Electrode islands are to be understood here as components of the first matrix which are insulated from one another (which are in particular arranged spaced apart from one another). The matrix formed by the electrode islands may be in the form of a "V" and/or a "W" and/or in the form of a "checkerboard pattern" or in the form of a cross. In particular, it is important that the electrode islands are spaced apart from each other. Each electrode island may here be connected to a voltage source. Thus, electrode islands may be understood as isolated layers of the transparent material (e.g. indium tin oxide) of the first electrode, which do not touch each other and which are arranged as a two-dimensional pattern distributed on the first area of the transparent piezoelectric layer. These layers may be polygonal, especially rectangular, as well as elliptical. For example, an electrode island may be arranged spaced apart from the edge of the second area. This means that the electrode island does not touch the edge of the first area. Furthermore, the module according to the invention comprises a conductive path arrangement comprising at least a first conductive path. For example, the conductive path arrangement may include five to 200 conductive paths. Here, at least the first conductive path is electrically connected to at least one of the electrode islands. In this regard, the electrode island may be powered via a conductive path arrangement comprising at least a first conductive path having an electrode pad disposed outside the first area and having a path to a voltage source. Thus, by applying an electrical voltage between the first and second electrodes between which the transparent piezoelectric material is located, a movement, in particular a vibration, of the piezoelectric material may be excited via the piezoelectric effect, which in turn causes the transparent substrate to vibrate. In the case of spacing the electrode island from the edge of the first area, haptic feedback may thus be caused at any position of the module by the vibration of the transparent substrate. Thus, for a user who is is touching the surface of the module, e.g., with his finger, a haptic feedback may be caused at any point of this surface. Site selectivity may be achieved by varying the vibration of the entire plate depending on the finger position. Furthermore, it is possible to cause a position-selective haptic feedback independent of other surface areas by position-selective vibration of the transparent substrate by selective control of the electrode islands.

At least the first conductive path and/or one of the electrode islands has a rough surface structure with a maximum roughness depth of 4 µm. The "maximum roughness depth" is the vertical difference between the deepest groove and the highest peak within the total measuring distance of a surface (see definition: http://www.technisches-zeichnen-.net/technisches-zeichnen/diverses/rauheitswerte.php). The grooves and peaks that define the roughness depth may form an ordered surface structure, in particular in the form of a moth-eye surface, or a disordered surface structure. Due to the roughness of the surface structure, in particular a scattering of the reflected light or even a reduction of the reflection intensity may be achieved by a reduction of the refractive index differences. Thus, the reflection intensity decreases. Thus, a coating with anti-gloss and/or anti-reflective properties may be obtained. Furthermore, the rough surface structure has the effect that foreign substances, which originate for example from a finger touching the surface, are less strongly adsorbed. This is particularly noticeable in a reduction of an imprint on the surface.

The first and/or the second electrode may, for example, comprise graphene and/or indium tin oxide (ITO) and/or silver nanowires and/or carbon nanotubes (CNT) and/or conductive polymers and/or Al-doped ZnO and/or nitrogen-doped diamond-like carbon and/or carbon nanowires.

The layer thickness is not critical here. The layer thickness should only be such that the above mentioned unevennesses may be realized.

Suitable transparent piezoelectric materials for the piezoelectric layer are in particular lead zirconate titanate (Pb($Zr_xTi_{1-x}$)$O_3$) and/or lead titanate (PbTiO$_3$) and/or barium titanate (BaTiO$_3$) and/or sodium niobate (NaNbO$_3$) and/or potassium niobate (KNbO$_3$) a lithium-doped potassium sodium niobate (K, Na)$_{1-x}$Li$_x$NbO$_3$ and/or scandium aluminium nitride (AlScN). The layer thickness of the piezoelectric material for the piezoelectric layer is in particular 150 to 1500 nm. With smaller layer thicknesses, it may not be possible to apply sufficiently high voltages to the piezoelectric layer, while with layer thicknesses that are too high, problems may arise with regard to mechanical layer stresses and reduced transparency.

In particular, the electrode islands may have side lengths and/or diameters of 20 µm to 500 µm. With smaller side lengths and/or diameters, disadvantageous space losses in favour of wiring may occur.

Thus, the module for a display and/or operating device may be attached to the part of the display and/or operating device on which the graphical display contents are presented and/or offered for interaction (i.e. to the display). For example, the free side, i.e., the uncoated side of the substrate, may be applied directly to the display of the display and/or operating device. Due to the spatially directly adjacent arrangement of the transparent electrodes to the piezoelectric material, additional mechanical coupling interfaces may thus be dispensed with, which makes the module simpler and more cost-effective to manufacture. Moreover, by spacing at least one electrode island of the first matrix from the edge of the first area, any position on the transparent module may be used for haptic feedback in a position-selective manner by exciting the piezoelectric material. Furthermore, the transparent module according to the invention may reduce distortion of graphical display contents, which occurs, for example, with the known non-transparent piezo actuators.

The electrode islands and the conductive paths combine a haptic actuator technology, anti-shine coating, anti-fingerprint coating and anti-reflective coating as an integrated approach. Due to the omission of additional components, the module performance may be improved, because in order to achieve a haptic feedback, an anti-gloss effect and an anti-fingerprint effect and an anti-reflective coating, an installation space minimization may be achieved compared to the known solutions. This reduces development and system costs and improves quality characteristics by reducing the number of discrete components and/or additional layers. "Anti-gloss surfaces" are understood to mean, in particular, scattering surfaces with a less directional and diffuse reflection. "Anti-reflection" is understood to mean, in particular, a reduction in the reflected light intensity by absorption of the light.

The subclaims show advantageous further developments of the invention.

In an advantageous further embodiment of the module according to the invention, the first and second areas of the transparent piezoelectric layer are parallel to each other. In other words, the first and second electrodes are disposed on opposite sides of the transparent piezoelectric layer.

In this way, the haptic feedback may be ideally realized.

According to another advantageous further embodiment of the module according to the invention, at least one of the electrode islands is arranged spaced apart from an edge of the first area. In this case, the electrode island may be arranged on the center and/or on a quadrant of the piezoelectric layer as desired. Further, two or more electrode islands may be arranged spaced apart from the edge of the first area. Particularly advantageously, all electrode islands are arranged spaced apart from the edge. Here, the electrodes spaced apart from the edge may have a line connecting the electrode islands to an electrode pad and which may be located at the edge or outside the transparent piezoelectric layer. Due to the arrangement of the electrode islands spaced apart from the edge of the first area, haptic feedback may be generated at any position of the module in a position-selective manner.

In a further advantageous embodiment of the module according to the invention, at least one of the electrode islands has its own independent voltage path to a voltage source. In other words, for at least one of the electrode islands of the first matrix, there exists a separate and independent circuit path which is configured to electrically connect the electrode island to a voltage source. This may be, for example, a conductive path connected to an electrode pad as described above.

This circuit path further comprises, for example, a transistor and/or a switch and/or a relay which closes the current path to a voltage source independently of the switching paths of the other electrode islands. Thus, a small region of the module according to the invention may be selectively controlled individually and independently. Furthermore, at least two, and in particular all, of the electrode islands may also have their own respective and independent circuit path to their own independent voltage source.

In a further advantageous embodiment, the electrode island comprises an elliptical shape and/or a polygonal shape, in particular a quadrangular shape. For example, a circular shape may also count among the elliptical shape. Furthermore, point-shaped electrode islands are also conceivable. For example, in the case of quadrangular shapes of the islands, a lamellar structure of the first matrix may also be formed.

According to another further embodiment, the second transparent electrode comprises a second matrix having a plurality of electrode islands. In order to avoid repetition, all features, effects and advantages which apply to the first electrode with the first matrix are hereby also referred to the second electrode with the second matrix. In particular, the use of a second matrix comprising a plurality of electrode islands may reduce the layer stress compared to a full coating within the module according to the invention.

In a preferred embodiment, the electrode islands of the first matrix and the second matrix are congruent with each other. In this way, a spatially optimized excitation of the piezoelectric layer may be achieved.

In an advantageous further development of the module according to the invention, the latter comprises an anti-scratch coating and/or a hydrophobic coating. In this way, the service life of the electrode islands and/or the conductive paths may be noticeably increased. Sctratch protection varnishes may be considered as anti-scratch coatings.

In an advantageous embodiment of the module according to the invention, the electrode islands and/or the conductive path arrangement and/or the conductive paths of the conductive path arrangement may have a regular surface structure with a maximum roughness depth from 300 to 700 nm, in particular 350 to 550 nm, and an average spacing between the elevations defining the roughness from 150 to 300 nm, in particular from 200 to 300 nm. The term distance in particular refers to a radial distance in all directions of a plane in which the elevations are located. A further reduction of the reflection intensity may be achieved by the regular arrangement of the elevations. This reduction is based on the reduction of refractive index differences, which is also called the "moth-eye effect".

In another advantageous further embodiment, the electrode islands and/or the conductive paths of the conductive path arrangement comprise surface cavities. This prevents in particular the formation of a greasy film on the surface. Thus, the anti-fingerprint properties may be improved. For example, surface cavities may have a maximum roughness depth of 4 µm.

The following aspects according to the invention comprise the advantageous embodiments and further embodiments as well as the general advantages of the device according to the invention and the respective technical effects associated therewith.

According to a second aspect, the present invention relates to a method of manufacturing a module according to the first aspect of the invention. For this purpose, a transparent substrate, e.g. a glass plate and/or a transparent plastic, is first coated with the second transparent electrode. This may be done, for example, by means of physical vapour deposition, e.g. sputtering and/or vapour deposition (comprising, for example, sputtering of indium tin oxide).

Subsequently, the electrode may be patterned, for example, using a dry etching process or a lithography process. Thereafter, the transparent piezoelectric material (e.g., lead zirconate titanate and/or doped and/or undoped aluminum nitride) is deposited onto the second transparent electrode. This may be done, for example, using a conventional sputtering process. Alternatively, a conventional sol-gel method is also possible, for example. In the case of the sol-gel method, in particular, a further drying step may take place. In a further step, the transparent piezoelectric material is coated on its first area with a first matrix of electrode islands, wherein at least one electrode island has a rough surface structure with a maximum roughness depth of 4 µm. Coating may be done by sputtering, as described above. The creation of the rough surface structure may be done by means of a dry etching and/or a lithographing (and/or a lithography process) and/or by means of laser treatment. In particular, the step of creating the rough surface structure may be performed after coating. Preferably, the rough surface structure comprises a moth-eye structure. The conductive paths, preferably metal components, are in particular also applied by a physical gas deposition process. In particular, a conductive path with a maximum roughness depth of 4 µm is applied. The coating technique used here corresponds to the technique used for coating the substrate. The patterning of the coatings may be carried out, for example, by means of a lithography process and/or a dry etching process. Here, physical processes (e.g. by argon ion bombardment) and/or chemical processes, such as etching with chlorine-containing gases (especially when patterning AlN or ScAlN), with the aid of an etching mask are conceivable. Furthermore, patterning may be carried out by means of laser techniques. In particular, the structure of the conductive path and/or the piezo material and especially the electrode islands may be defined. Thus, a module with a haptic-actuator, anti gloss, anti fingerprint as well as an anti-reflective coating may be produced within one manufacturing process without the need for additional production steps and production materials. This allows production costs to be reduced, as materials and process steps are saved.

According to a third aspect, the invention relates to a display and/or operating device comprising a module according to the first aspect. In this case, the module is arranged as a transparent module on the display area and/or the display of the display and/or operating device. Further, the display and/or operating device may comprise an evaluation unit, for example a CPU and/or a microcontroller. Additionally, the display and/or operating device may include a sensor, such as a camera and/or a touch sensor (e.g., a sensor glass). Furthermore, the display and/or operating device may comprise a voltage source. Here, the first and second transparent electrodes, in particular the electrode islands of the first and/or second matrix, may be connected to the voltage source. The evaluation unit is configured to close the electric circuit with the two transparent electrodes and the voltage source via the control of switches and/or transistors and/or relays, and thus to ensure that a potential is applied to the transparent electrodes for the excitation of the piezoelectric material. The evaluation unit may thus also cause a potential to be applied to individual electrode islands in order to cause excitation of the transparent piezoelectric layer at the position of the respective electrode island and thus haptic feedback at any position of the transparent module. The motion sensor and/or the camera may also be connected to the evaluation unit. If an object is detected by the sensor, for example by touching the surface of the module, the evaluation unit may be configured to apply a potential at this point by connecting the electrodes accordingly.

According to a fourth aspect, the invention relates to a means of transport comprising a display and/or operating device according to the third aspect. In this case, the display and/or operating device is permanently installed in the means of transport and is not designed as a portable device. Possible means of transport within the meaning of the invention are, for example, automobiles, in particular cars and/or trucks, and/or aircraft and/or ships and/or motorcycles.

BRIEF DESCRIPTION OF THE FIGURES

Further details, features and advantages of the invention result from the following description and figures, in which.

DETAILED DESCRIPTION

Figure 1A:
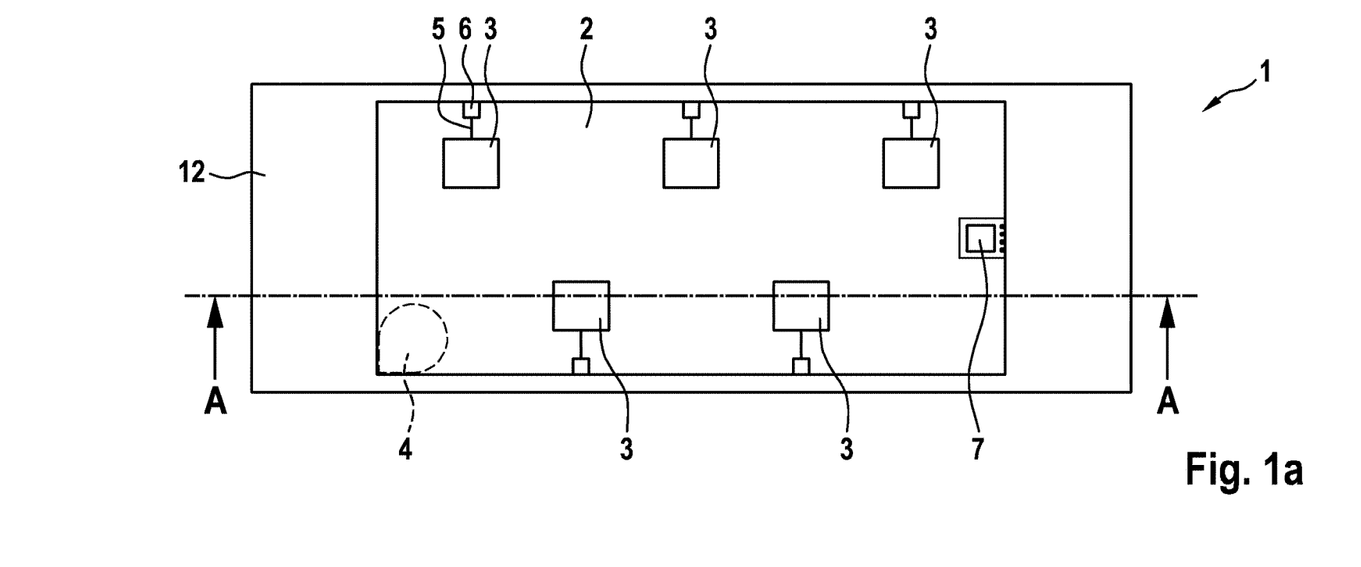
FIG. 1a shows an embodiment of a module according to the invention.
Figure 1B:
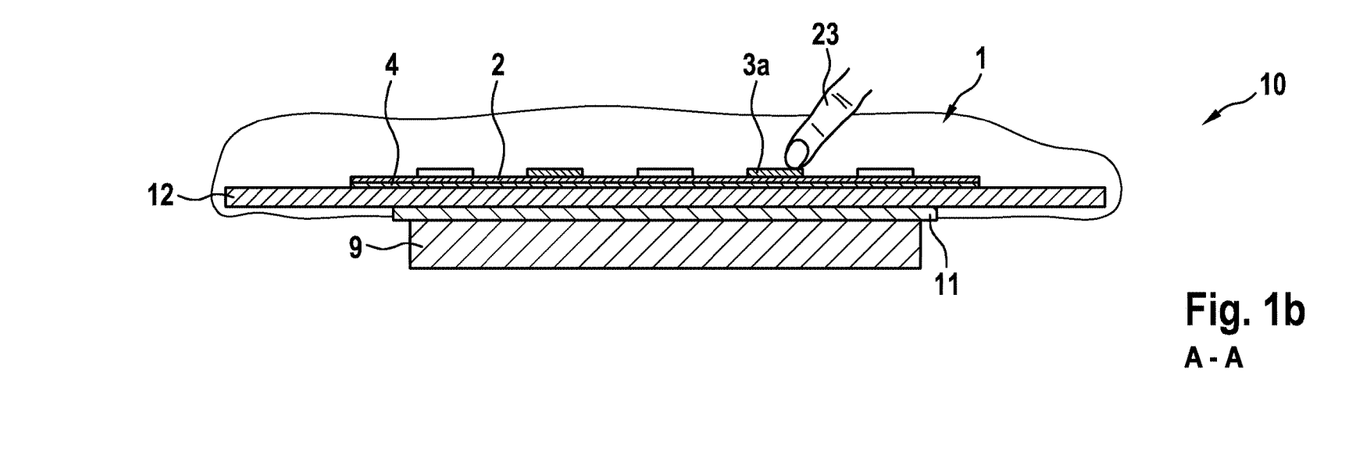
FIG. 1b shows an embodiment of the display and/or operating device according to the invention.

FIG. 1a shows an embodiment of a module 1 according to the invention. Here, the electrode islands 3a, 3b, 3c of a first matrix of a first transparent electrode 3 are arranged in a "W" shape. An electrical voltage may be applied independently and separately to the electrode islands 3a, 3b, 3c by means of the lines 5 and the first electrode pads 6 and a circuit arranged thereon. Further, the transparent piezoelectric layer 2 (e.g., AlScN) is coated with electrode islands 3a, 3b, 3c comprising, for example, indium tin oxide. Moreover, the dashed circular line shows the second transparent electrode 4, which comprises, for example, indium tin oxide. The second transparent electrode 4 may be connected and/or interconnected to a second electrode pad 7, which is also conceptually disposed below the piezoelectric material 2 and is shown for illustrative purposes only. Furthermore, the second transparent electrode 4 (below the transparent piezoelectric material 2) is arranged on a transparent substrate 12, for example glass. FIG. 1b shows an embodiment of the display and/or operating device 10 according to the invention. Here, a cross-section A-A of the module 1 according to the invention is shown. In addition to the module 1 according to the invention, a display 9, which is used for displaying display contents and for interaction by a user, and a sensor 11, in particular a sensor glass, are shown here. The sensor 11 may, for example, detect the finger 23 of a user who wishes to interact with the content of the display 9 by means of a touch. After this is detected by the sensor 11, a time-varying electric voltage is applied between the respective electrode island 3a, 3b, 3c and the second transparent electrodes 4. This generates a vibration of the transparent piezoelectric layer 2 at one or more determined first electrode islands 3a, thereby causing the transparent substrate 12 to vibrate. Hereby, the user experiences vibration and/or haptic feedback at the position of his finger 23.

Figure 2:
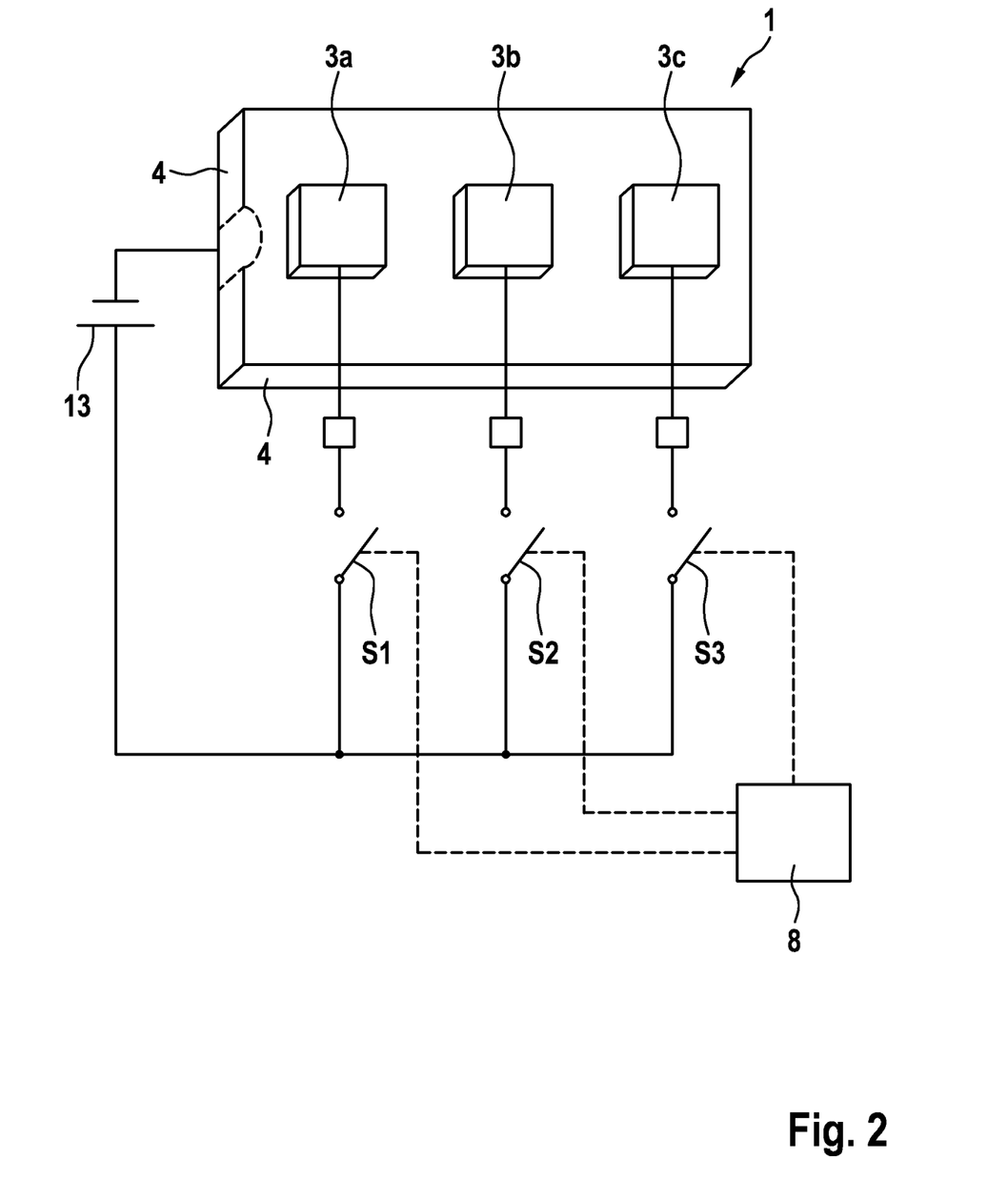
FIG. 2 shows an embodiment of the module according to the invention.

FIG. 2 shows an embodiment of the module 1 according to the invention to illustrate the independent and separate switching paths of the electrode islands 3a, 3b, 3c. Here, the second transparent electrode 4 and the electrode islands 3a, 3b, 3c are selectively connectable to a voltage source 13. Furthermore, it is possible that each pair of electrodes comprising electrode island 3a, 3b, 3c and second transparent electrode 4 has an individual voltage source. By closing one of the switches S1, S2, S3 one of the electrode islands 3a, 3b, 3c may be controlled separately. If an electrical voltage is to be applied only to a first electrode island 3a, the first switch S1 may be closed. If this is to be done for the first and third electrode islands 3a, 3c, the first and third switches S1, S3 may be closed, and so on. The closing and opening of the switches S1, S2, S3 may be controlled by means of an evaluation unit 8.

Figure 3:
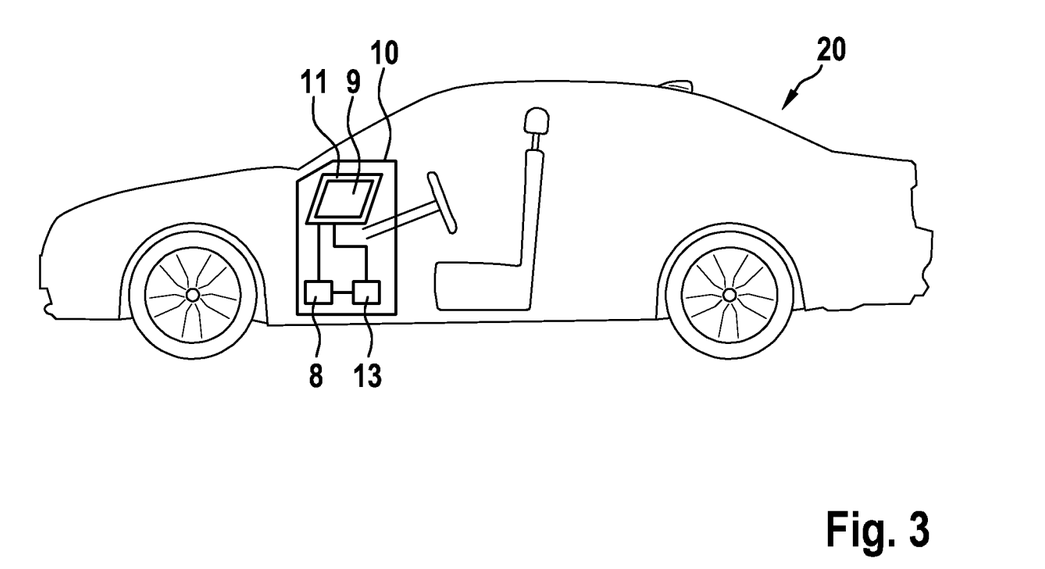
FIG. 3 shows an embodiment of a means of transport according to the invention.

FIG. 3 shows an embodiment of an inventive means of transport 20 (in the form of an automobile) comprising a display and/or operating device 10 according to the invention. By means of a sensor 11, for example by means of a capacitive sensor, a touch of the module 1 by the user may be detected. A vibration at a position of the electrode island 3a, 3b, 3c may be excited via the evaluation unit 8.

Figure 4:
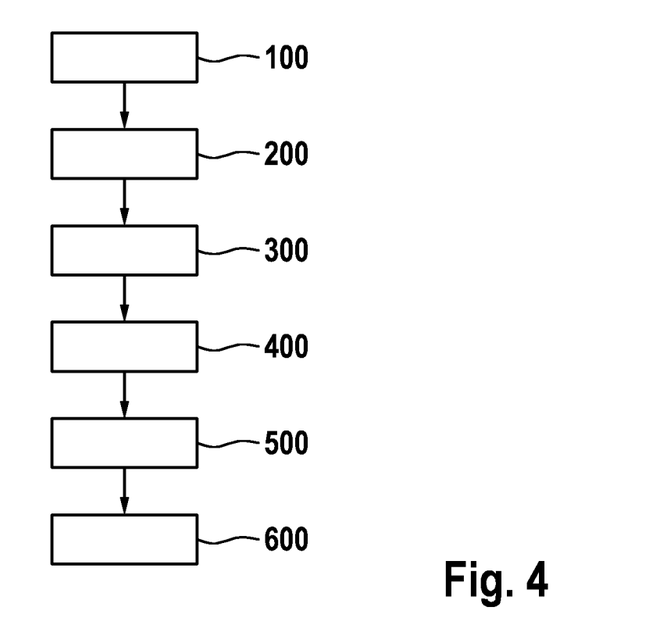
FIG. 4 shows a flow chart of an embodiment of the method according to the invention.

FIG. 4 shows a flow chart of an embodiment of the method according to the invention for manufacturing a module 1 for a display and/or operating device 10. In a first step 100, a coating of the transparent substrate 12 with a second transparent electrode 4, for example indium tin oxide, is carried out via a physical gas deposition process. In a second step 200, the second transparent electrode 4 is patterned. In a third step 300, the second transparent electrode 4 is coated with a transparent piezoelectric material (e.g., AlScN or PZT); for example, via a sputtering and/or sol-gel method. This is followed, in a fourth step 400, by drying in the case of a sol-gel method. In the fifth step 500, the transparent piezoelectric layer 2 is coated by means of a physical gas deposition (e.g. with indium tin oxide and metals, e.g. silver for the conductive paths 24a-24e) to form a matrix with electrode islands 3a, 3b, 3c, i.e. a first transparent electrode 3 on the transparent piezoelectric layer 2. In a sixth step 600, the matrix and the conductive paths 24a-24e are patterned to obtain the module 1 according to the invention. Here, a dry etching process and/or a lithography process is used to generate rough surface structures on the electrode islands 3a, 3b, 3c and the conductive paths 24a-24, wherein the rough surface structures have a disordered rough surface structure with a maximum roughness depth of 1 µm. Otherwise, ordered structures with elevations having a height of 500 nm may also be generated, with the elevations having an average distance of 250 nm between each other in the radial direction. Such a structure is also called a "moth-eye structure".

Figure 5A:
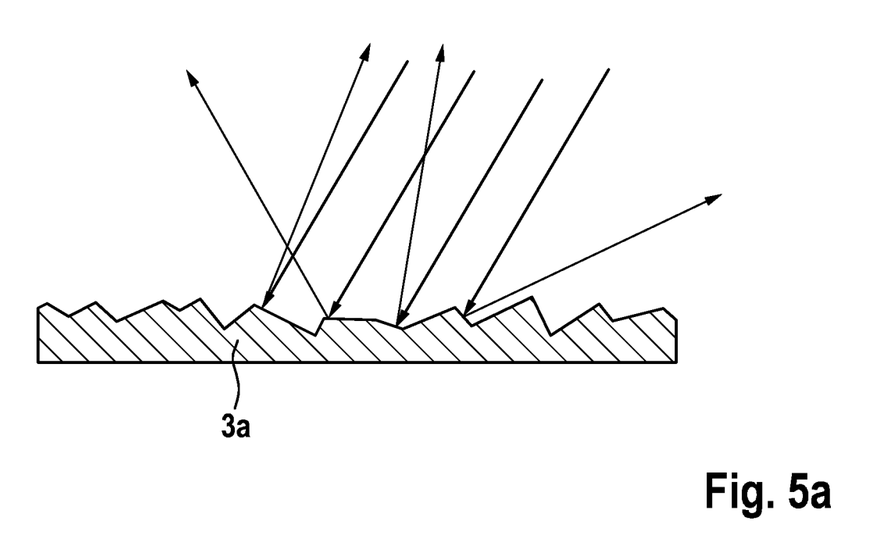
FIG. 5a is a microscopic representation of a scattering during reflection from an embodiment of an electrode island according to the invention.

FIG. 5a shows a microscopic view of a light scattering generated by the rough surface structure of a first electrode island 3a. The light rays irradiated onto the rough surface, which are shown with arrows pointing to the surface, experience scattering at the surface of the first electrode island 3a due to its roughness. This scattering is represented by the arrows pointing away from the surface of electrode island 3a. In this case, the surface has a disordered roughness structure in which the maximum roughness depth is e.g. 2 µm.

Figure 5B:
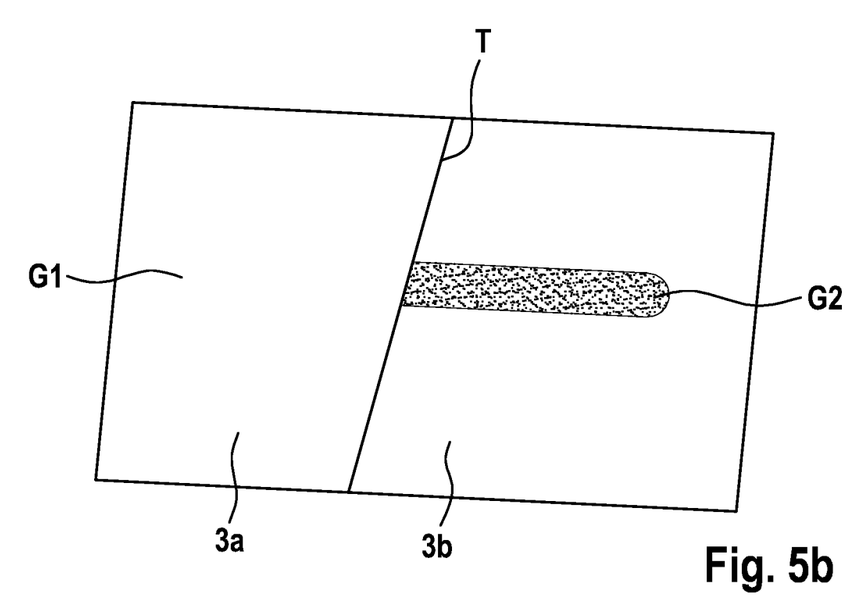
FIG. 5b is a macroscopic representation of a scattering at an embodiment of an electrode island according to the invention.

FIG. 5b shows a macroscopic representation of the anti-gloss effect produced by the microscopic structure of FIG. 5a. The first electrode island 3a on the left side has a surface structure as shown in FIG. 5a. The first gloss G1 on the left side is clearly weakened by the scattering. The second electrode island 3b on the right side, which is separated from the left electrode island by the separating line T, does not have a rough surface structure according to the invention, which is why its second gloss G2 is more intense than the first gloss G1.

Figure 6:
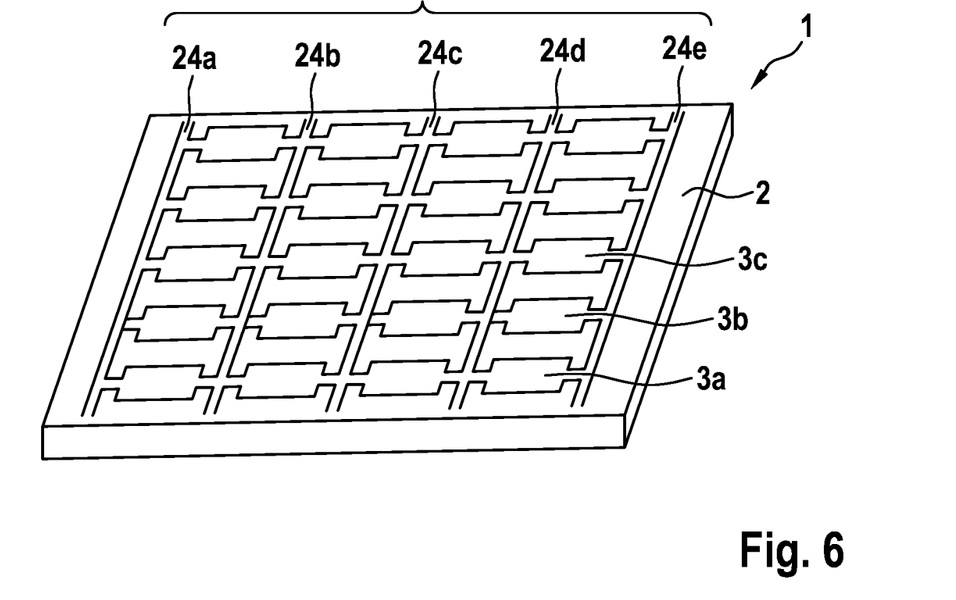
FIG. 6 shows an embodiment of the module according to the invention.

FIG. 6 shows an embodiment of a module 1 according to the invention. The module comprises electrode islands 3a to 3c, a transparent piezoelectric layer 2, and a conductive path arrangement comprising first to fifth conductive paths 24a to 24e. Here, the electrode islands 3a to 3c, etc., are connected to the conductive paths 24a to 24e.

Figure 7:
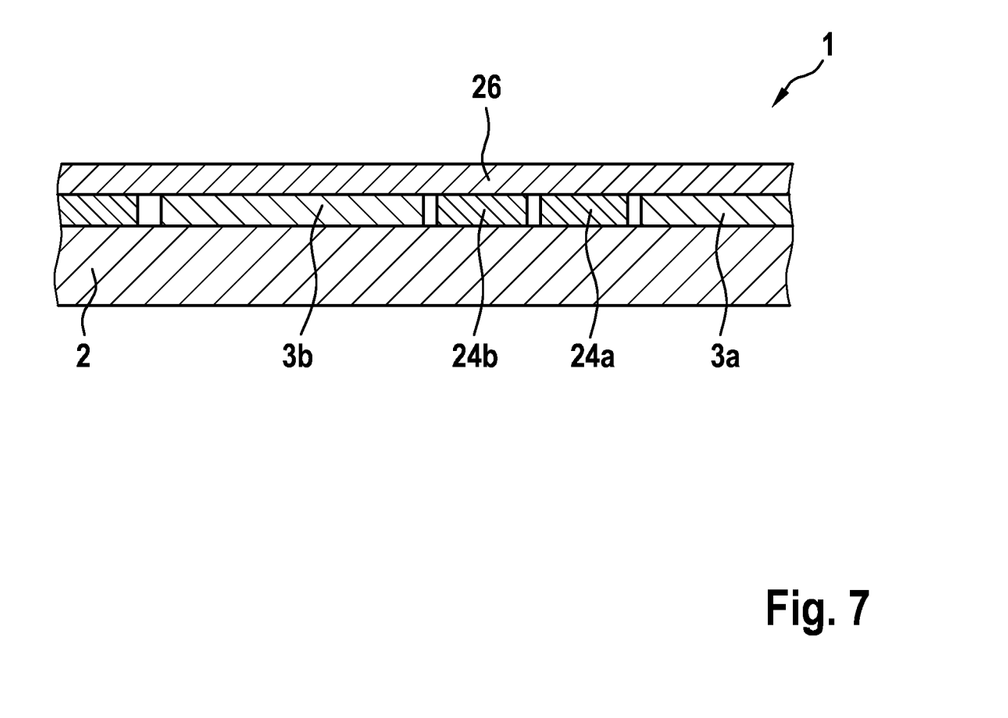
FIG. 7 shows a cross-section of an embodiment of a module according to the invention with a hydrophobic coating.

FIG. 7 shows a cross-section of the module 1 according to the invention. Here, the electrode islands 3a, 3b and the conductive paths 24a to 24e are additionally coated with a hydrophobic coating 26.

Figure 8A:
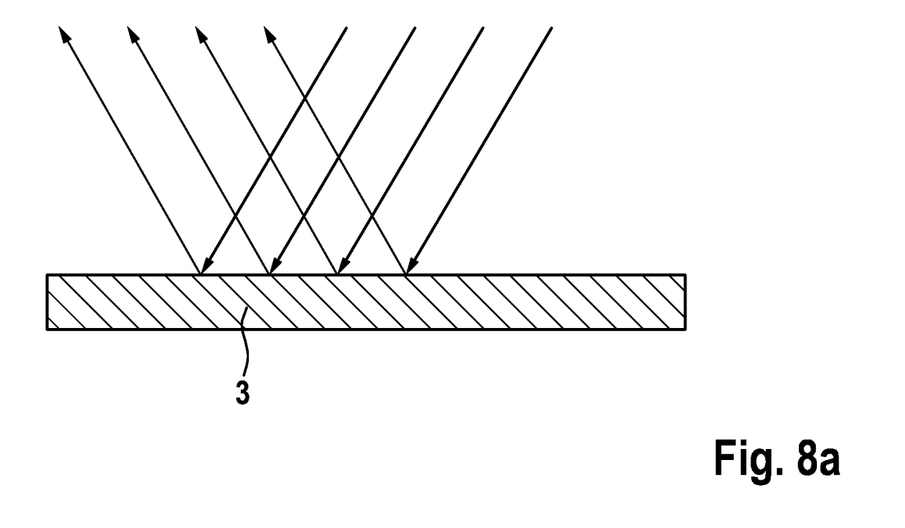
FIG. 8a is a representation of a reduction in reflection intensity with an embodiment of an electrode island according to the invention with an ordered surface structure.

FIG. 8a shows a reduction of a reflection intensity by a surface of an electrode island 3, which in particular has elevations of 500 nm. The average distance between these elevations in the radial direction is in particular 250 nm. This results in an orderly moth-eye structure. This moth-eye structure reduces the intensity of the reflected light rays, which is represented by the arrows pointing away from the surface, by reducing the refractive index differences. This is also known as the "moth eye effect". As a result, an anti-reflective effect may be achieved by this.

Figure 8B:
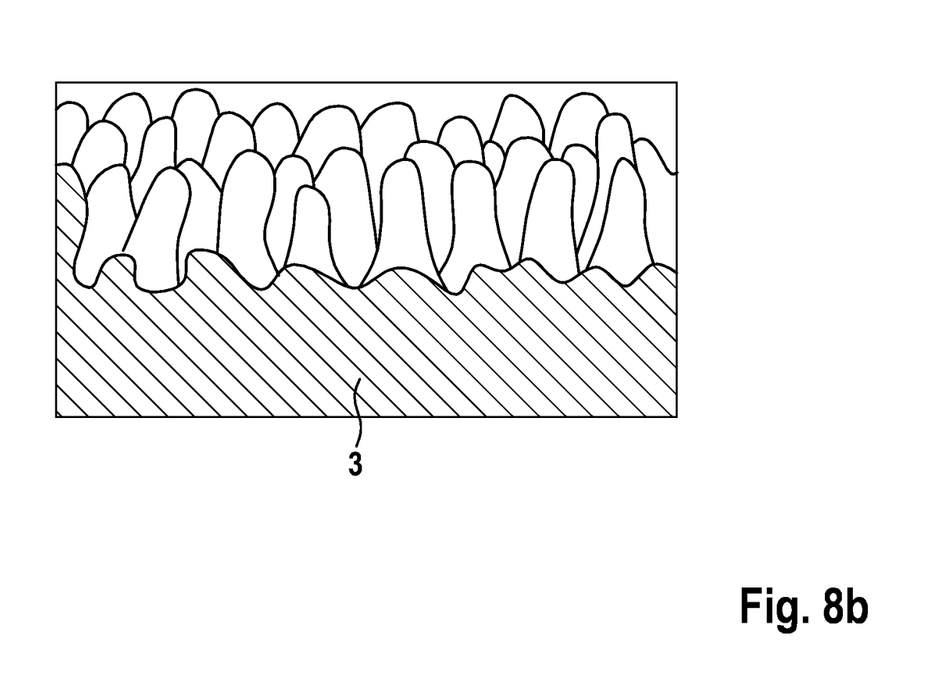
FIG. 8b is a microscopic representation of an ordered surface structure at an embodiment of an electrode island according to the invention.

FIG. 8b shows a TEM recording of the surface and/or moth-eye structure referred to in the description of FIG. 8a.

Figure 9A:
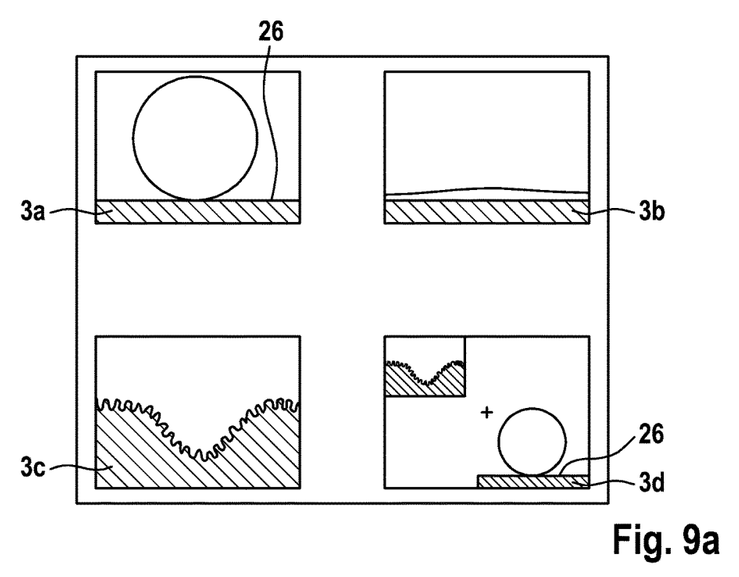
FIG. 9a is an overview of technical realization possibilities of an anti-fingerprint effect for the electrode islands according to the invention.

FIG. 9a shows possible implementations of the anti-fingerprint coating according to the invention. The first electrode island 3a of this figure is coated with a hydrophobic substance 26, which has a low surface energy. In this way, wetting may ideally be achieved at a wetting angle, in the case of wetting with a polar liquid such as water, of 180°. In contrast, the second electrode island 3b has a coating with a high surface energy, resulting in a wetting angle of 0°. The third electrode island 3c has cavities in addition to the surface structuring with a maximum roughness depth of, for example, 3 µm. In this way, a greasy film, which may arise due to a fingerprint, for example, may adsorb more poorly on the surface. This results in an anti-fingerprint coating. Furthermore, the properties of a hydrophobic coating 26 and a rough surface texturing according to the invention may be combined, as shown for the fourth electrode island 3d.

Figure 9B:
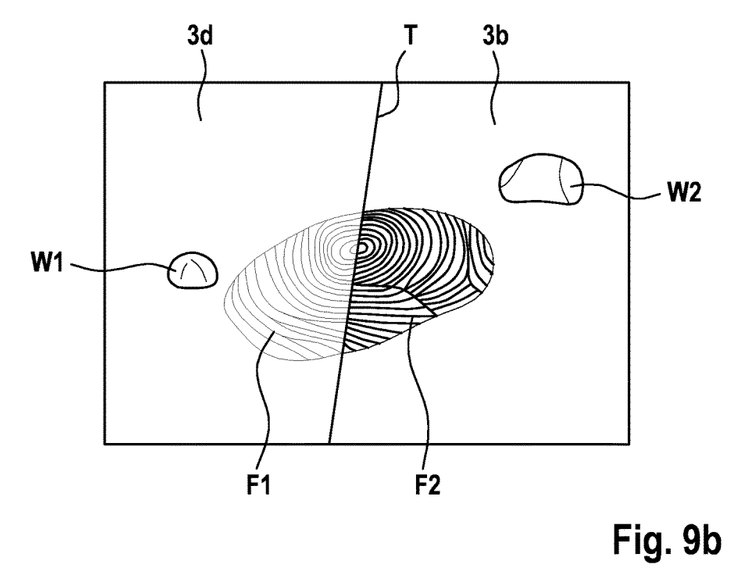
FIG. 9b is a macroscopic representation of the anti-fingerprint effect of an embodiment of the electrode island according to the invention.

FIG. 9b shows a comparison of a first fingerprint F1 and a second fingerprint F2 on the fourth electrode island 3d and the second electrode island 3b. The fourth electrode island 3d has a hydrophobic coating and a rough surface structuring according to the invention. The second electrode island 3b has only a hydrophilic surface coating. By comparing the fingerprints F1, F2 to the left and right of the separating line T, it may be clearly seen that the fingerprint T1 on the fourth electrode island 3d is less clearly visible than the fingerprint T2 on the second electrode island 3b. Furthermore, the wetting angle of the first water droplet W1 is significantly larger than that of the second water droplet W2.

For a better understanding, the invention will be explained with reference to an embodiment. ITO is deposited on a transparent substrate by sputter deposition. Subsequent patterning is carried out by means of lithography and dry etching. This is followed by sputter deposition of ScAlN onto the existing layer and subsequent patterning by lithography and dry etching. The next step is the deposition of ITO by sputter deposition followed by patterning by lithography and dry etching. Finally, the entire surface is coated with a passivation layer (e.g. by low-pressure chemical vapour deposition (LPCVD) and/or plasma-enhanced chemical vapour deposition (PECVD) and/or sputtering), followed by opening the passivation layer at the points where the two electrodes are electrically contacted to the drive by lithography and dry etching.

LIST OF REFERENCE NUMERALS

1 Module
2 Transparent piezoelectric layer
3 First transparent electrode
3a First electrode island
3b Second electrode island
3c Third electrode island
4 Second transparent electrode
5 Line
6 First electrode pad
7 Second electrode pad
8 Evaluation unit
9 Display
10 Display and/or operating device
11 Sensor
12 Transparent substrate
13 Voltage source
20 Means of transport
23 Fingers
24a First conductive path
24b Second conductive path
24c Third conductive path
24d Fourth conductive path
24e Fifth conductive path
25 Conductive path arrangement
26 Hydrophobic coating
A-A Cross section
S1 First switch
S2 Second switch
S3 Third switch
100-600 Method acts
D Transmitted radiation
G1 First gloss
G2 Second gloss
R1 First reflected light beam
R2 Second reflected light beam
T Separating line
λ Wavelength

The invention claimed is:

1. A module for a display and/or operating device, the module comprising
 a first transparent electrode comprising a first matrix of a plurality of electrode islands;
 a transparent piezoelectric layer having a first and a second area;

a second transparent electrode;

a transparent substrate; and a conductive path arrangement with at least one first conductive path on the transparent piezoelectric layer, wherein the transparent substrate is coated with the second transparent electrode and the second transparent electrode is arranged between the transparent substrate and the transparent piezoelectric layer, and the first area is coated with the first transparent electrode and the second area is coated with the second transparent electrode; and the electrode islands are arranged electrically insulated from each other on the first area of the transparent piezoelectric material, wherein at least the first conductive path of the conductive path arrangement is electrically connected to at least one of the electrode islands, and at least the first conductive path and/or at least one of the electrode islands has a rough surface structure with a maximum roughness depth of 4 µm.

2. The module according to claim 1, further comprising an anti-scratch coating and/or a hydrophobic coating on the first transparent electrode.

3. The module according to claim 1, wherein the electrode islands and/or the conductive path arrangement have a regular surface structure with a maximum roughness depth from 150 to 300 nm and an average distance between elevations defining the roughness from 300 to 700 nm.

4. The module according to claim 1, wherein the electrode islands and/or the conductive path arrangement comprise surface cavities.

5. The module according to claim 1, wherein the surface cavities have a depth of at least 4 µm.

6. A method of manufacturing a module according to claim 1, comprising the steps of:

coating a second area of a transparent substrate with a second transparent electrode;

coating the second electrode with a transparent piezoelectric layer; and coating of a first area of the transparent piezoelectric layer with a first transparent electrode in the form of a first matrix comprising electrode islands arranged electrically insulated from one another, wherein at least one first conductive path and/or at least one of the electrode islands has a rough surface structure with a maximum roughness depth of 4 µm.

7. The method according to claim 6, further comprising a step of patterning, in particular dry etching and/or lithographing and/or by means of a laser treatment, to produce the rough surface structure.

8. The method according to claim 7, wherein the patterning to produce the rough surface structure is performed after the step of coating.

9. The method according to claim 6, wherein the rough surface structure comprises a moth-eye structure.

10. A display and/or operating device comprising a module according to claim 1, wherein the module is arranged as a transparent module on the display of the display and/or operating device.

11. A vehicle comprising a display and/or operating device according to claim 10, wherein the display and/or operating device is fixedly mounted in the vehicle.

* * * * *